United States Patent
Zhang

(10) Patent No.: US 10,559,574 B2
(45) Date of Patent: Feb. 11, 2020

(54) THREE-DIMENSIONAL VERTICAL ONE-TIME-PROGRAMMABLE MEMORY COMPRISING SCHOTTKY DIODES

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

(*) Notice: Subject to any disclaimer, the term of this patent is extended or adjusted under 35 U.S.C. 154(b) by 0 days.

(21) Appl. No.: 15/947,852

(22) Filed: Apr. 8, 2018

(65) Prior Publication Data

US 2018/0226414 A1    Aug. 9, 2018

Related U.S. Application Data

(63) Continuation-in-part of application No. 15/488,489, filed on Apr. 16, 2017, now Pat. No. 10,002,872.

(30) Foreign Application Priority Data

| Apr. 16, 2016 | (CN) | ............................ 2016 1 0234999 |
| Jan. 22, 2018 | (CN) | ............................ 2018 1 0056753 |
| Jan. 25, 2018 | (CN) | ............................ 2018 1 0072197 |
| Jan. 26, 2018 | (CN) | ............................ 2018 1 0075105 |

(51) Int. Cl.
*H01L 27/112*  (2006.01)
*H01L 23/525* (2006.01)
*H01L 27/24*  (2006.01)
*H01L 29/66*  (2006.01)
*G11C 17/16*  (2006.01)
*H01L 27/06*  (2006.01)

(52) U.S. Cl.
CPC ........ *H01L 27/11206* (2013.01); *G11C 17/16* (2013.01); *H01L 23/5252* (2013.01); *H01L 27/2454* (2013.01); *H01L 29/66143* (2013.01); *H01L 27/0688* (2013.01)

(58) Field of Classification Search
CPC .......... H01L 27/11206; H01L 27/0688; H01L 27/2454; H01L 27/1128; H01L 27/11514; H01L 27/11597; H01L 23/5252; H01L 29/66143; H01L 29/782; H01L 45/04; H01L 45/06; H01L 45/08; H01L 45/1675; H01L 2924/12032; G11C 17/16; G11C 17/165; G11C 13/0004; G11C 13/0007
See application file for complete search history.

(56) References Cited

U.S. PATENT DOCUMENTS

| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |

(Continued)

*Primary Examiner* — Michael M Trinh

(57) ABSTRACT

The present invention discloses a three-dimensional vertical read-only memory (3D-OTP$_V$) comprising Schottky diodes. It comprises a plurality of vertical OTP strings formed side-by-side on a substrate circuit. Each OTP string is vertical to the substrate and comprises a plurality of vertically stacked OTP cells. Each OTP cell comprises an antifuse layer. A plurality of Schottky diodes are formed between the horizontal address lines and the vertical address lines.

13 Claims, 13 Drawing Sheets

(56) References Cited

U.S. PATENT DOCUMENTS

| | | |
|---|---|---|
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A * | 11/1998 | Zhang .................... G11C 17/12 365/51 |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 7,442,997 B2 * | 10/2008 | Zhang .................... G11C 5/063 257/183 |
| 7,499,355 B2 * | 3/2009 | Scheuerlein ........... G11C 5/145 365/201 |
| 9,356,236 B2 * | 5/2016 | Park .................... G11C 11/1657 |
| 2011/0065272 A1 * | 3/2011 | Mizukami ........... H01L 23/5226 438/637 |
| 2017/0148851 A1 * | 5/2017 | Hsu .................... H01L 27/11514 |

* cited by examiner

THREE-DIMENSIONAL VERTICAL ONE-TIME-PROGRAMMABLE MEMORY COMPRISING SCHOTTKY DIODES

CROSS-REFERENCE TO RELATED APPLICATIONS

This application is a continuation-in-part of "Three-Dimensional Vertical One-Time-Programmable Memory", application Ser. No. 15/488,489, filed on Apr. 16, 2017, now U.S. Pat. No. 10,002,872, which claims priority from Chinese Patent Application 201610234999.5, filed on Apr. 16, 2016, in the State Intellectual Property Office of the People's Republic of China (CN), the disclosure of which is incorporated herein by reference in its entirety.

This application also claims priority from Chinese Patent Application 201810056753.2, filed on Jan. 22, 2018; Chinese Patent Application 201810072197.8, filed on Jan. 25, 2018; Chinese Patent Application 201810075105.1, filed on Jan. 26, 2018; in the State Intellectual Property Office of the People's Republic of China (CN), the disclosure of which are incorporated herein by references in their entireties.

BACKGROUND

1. Technical Field of the Invention

The present invention relates to the field of integrated circuit, and more particularly to one-time-programmable memory (OTP).

2. Prior Art

Three-dimensional one-time-programmable memory (3D-OTP) is a monolithic semiconductor memory. It comprises a plurality of vertically stacked OTP cells. In a conventional OTP, the OTP cells are formed on a two-dimensional (2-D) plane (i.e. on a semiconductor substrate). In contrast, the OTP cells of the 3D-OTP are formed in a three-dimensional (3-D) space. The 3D-OPT has a large storage density and a low storage cost. Because the 3D-OTP has a long data retention (>100 years), it is suitable for long-term data storage.

U.S. Pat. No. 5,838,396 issued to Zhang on Nov. 10, 1998 discloses a 3D-OTP. It comprises a semiconductor substrate and a plurality of OTP levels stacked above the semiconductor substrate. Transistors in the substrate and interconnects thereof form a substrate circuit (including the peripheral circuit of the 3D-OTP). Each OTP level comprises a plurality of address lines (including word lines and bit lines) and OTP cells. Each OTP level further comprises a plurality of OTP arrays. Each OTP array is a collection of all OTP cells which share at least one address line. Contact vias couple the address lines with the substrate circuit.

Because all address lines are horizontal, the 3D-OTP is a horizontal 3D-OTP (3D-OTP$_H$). When the storage capacity of the 3D-OTP$_H$ exceeds 100 Gb, its minimum feature size goes to 1xnm. The formation of the 1x-nm feature size requires a high-precision lithography such as multiple patterning (e.g. double patterning, or quadruple patterning). This would increase the 3D-OTP cost. Furthermore, as more OTP levels are vertically stacked, planarization becomes more and more difficult. As a result, the 3D-OTP$_H$ only comprises a small number of the OTP levels.

Objects and Advantages

It is a principle object of the present invention to provide a 3D-OTP with a large storage capacity.

It is a further object of the present invention to provide a 3D-OTP with a low storage cost.

It is a further object of the present invention to minimize the number of high-precision lithography steps during the manufacturing of the 3D-OTP.

It is a further object of the present invention to increase the number of the OTP levels in the 3D-OTP.

It is a further object of the present invention to provide a properly working 3D-OTP even with leaky OTP cells.

In accordance with these and other objects of the present invention, the present invention discloses a three-dimensional vertical one-time-programmable memory (3D-OTP$_V$).

SUMMARY OF THE INVENTION

The present invention discloses three-dimensional vertical one-time-programmable memory (3D-OTP$_V$). It comprises a plurality of vertical OTP strings formed side-by-side on the substrate circuit. Each OTP string is vertical to the substrate and comprises a plurality of vertically stacked OTP cells. To be more specific, the 3D-OTP$_V$ comprises a plurality of vertically stacked horizontal address lines (word lines). After the memory holes penetrating these horizontal address lines are formed, the sidewall of each memory hole is covered with an antifuse layer before the memory hole is filled with at least a conductive material, which could be a metallic material or a doped semiconductor material. The conductive material in each memory hole forms a vertical address line (bit line). The OTP cells are formed at the intersections of the word lines and the bit lines.

Each OTP cell comprises an antifuse and a diode. The antifuse comprises an antifuse layer, which is a layer of insulating dielectric (e.g. silicon oxide, or silicon nitride) and is irreversibly switched from a high-resistance state to a low-resistance state during programming. In a multi-bit-per-cell 3D-OTP$_V$, each OTP cell stores n (n>1) bits. It has N (N>2) states. The OTP cells in different states are programmed by different programming currents and therefore, have different resistance. The diode comprises a quasi-conductive layer (also known as diode layer, steering element, quasi-conduction layer, or other names in other patents and patent applications), which is broadly interpreted as any layer whose resistance at the read voltage (i.e. the read resistance) is substantially lower than when the applied voltage has a magnitude smaller than or polarity opposite to that of the read voltage.

In an OTP cell, the dimension of the diode's cathode is equal to the radius of the memory hole. Because this cathode is too small to suppress the leakage current of the diode, the OTP cell could be leaky. To address this issue, the present invention discloses a full-read mode. For the full-read mode, all OTP cells on a selected word line are read out during a read cycle. The read cycle includes two read phases: a pre-charge phase and a read-out phase. During the pre-charge phase, all address lines (including all word and all bit lines) in an OTP array are charged to a pre-determined voltage. During the read-out phase, after its voltage is raised to the read voltage $V_R$, a selected word line starts to charge all bit lines through the associated OTP cells. By measuring the voltage change on the bit lines, the states of the associated OTP cells can be determined.

Accordingly, the present invention discloses a three-dimensional vertical read-only memory (3D-OTP$_V$), comprising: a semiconductor substrate comprising a substrate circuit; at least a vertical OTP string formed on said semiconductor circuit, said OTP string comprising a plurality of vertically stacked OTP cells coupled to a vertical address line; each of said OTP cells comprises an antifuse layer, wherein said antifuse layer is irreversibly switched from a high-resistance state to a low-resistance state during programming.

The present invention further discloses a three-dimensional vertical read-only memory (3D-OTP$_V$), comprising: a semiconductor substrate comprising a substrate circuit; a plurality of vertically stacked horizontal address lines above said semiconductor circuit; at least a memory hole through said plurality of horizontal address lines; an antifuse layer formed on the sidewall of said memory hole, wherein said antifuse layer is irreversibly switched from a high-resistance state to a low-resistance state during programming; a vertical address line formed by filling at least a conductive material in said memory hole; an OTP string comprising a plurality of OTP cells formed at the intersections of said horizontal address lines and said vertical address line.

Figure 1A:
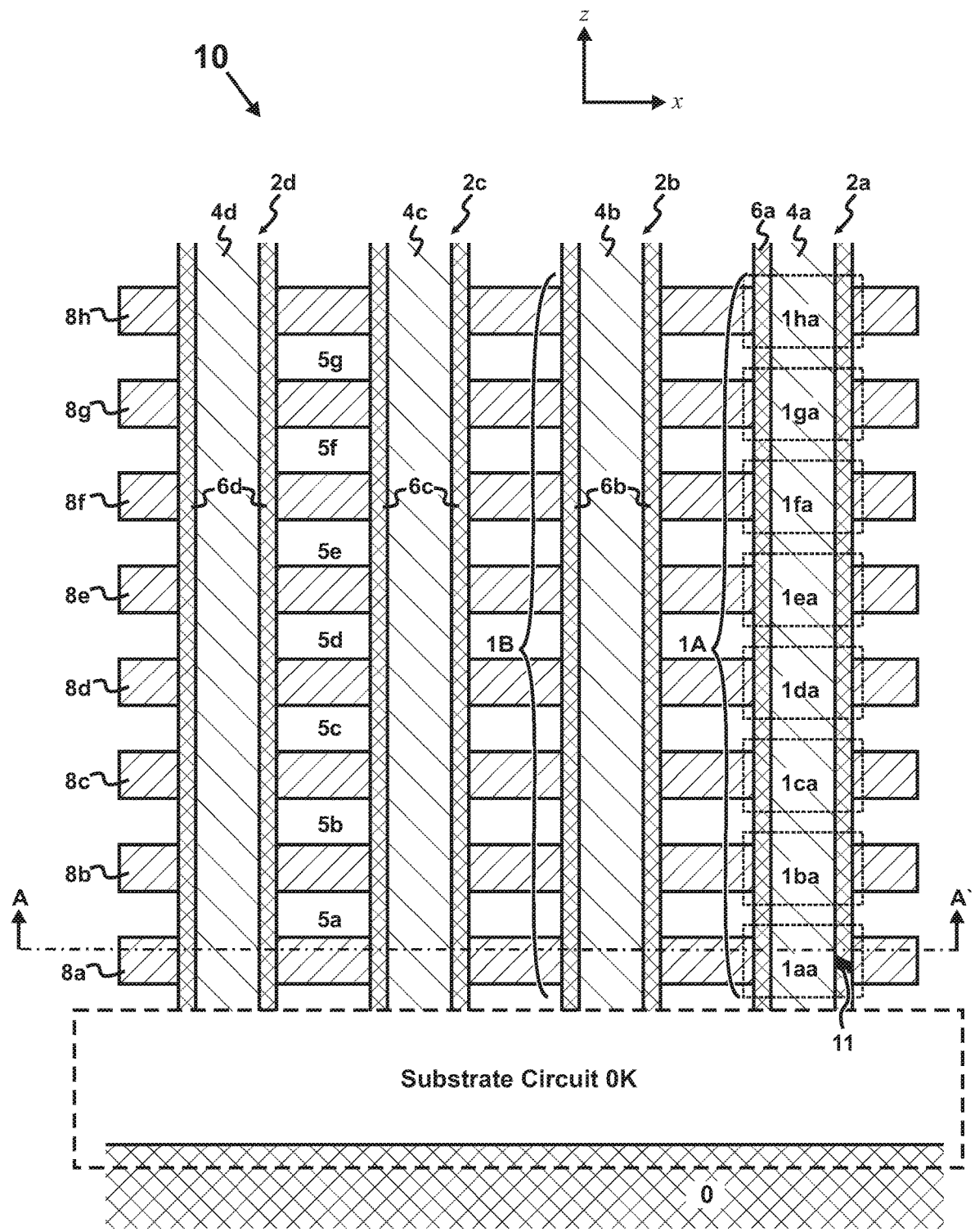
FIG. 1A is a z-x cross-sectional view of a first preferred 3D-OTP$_V$.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The symbol "/" means a relationship of "and" or "or".

Throughout the present invention, the phrase "on the substrate" means the active elements of a circuit are formed on the surface of the substrate, although the interconnects between these active elements are formed above the substrate and do not touch the substrate; the phrase "above the substrate" means the active elements are formed above the substrate and do not touch the substrate.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1B:
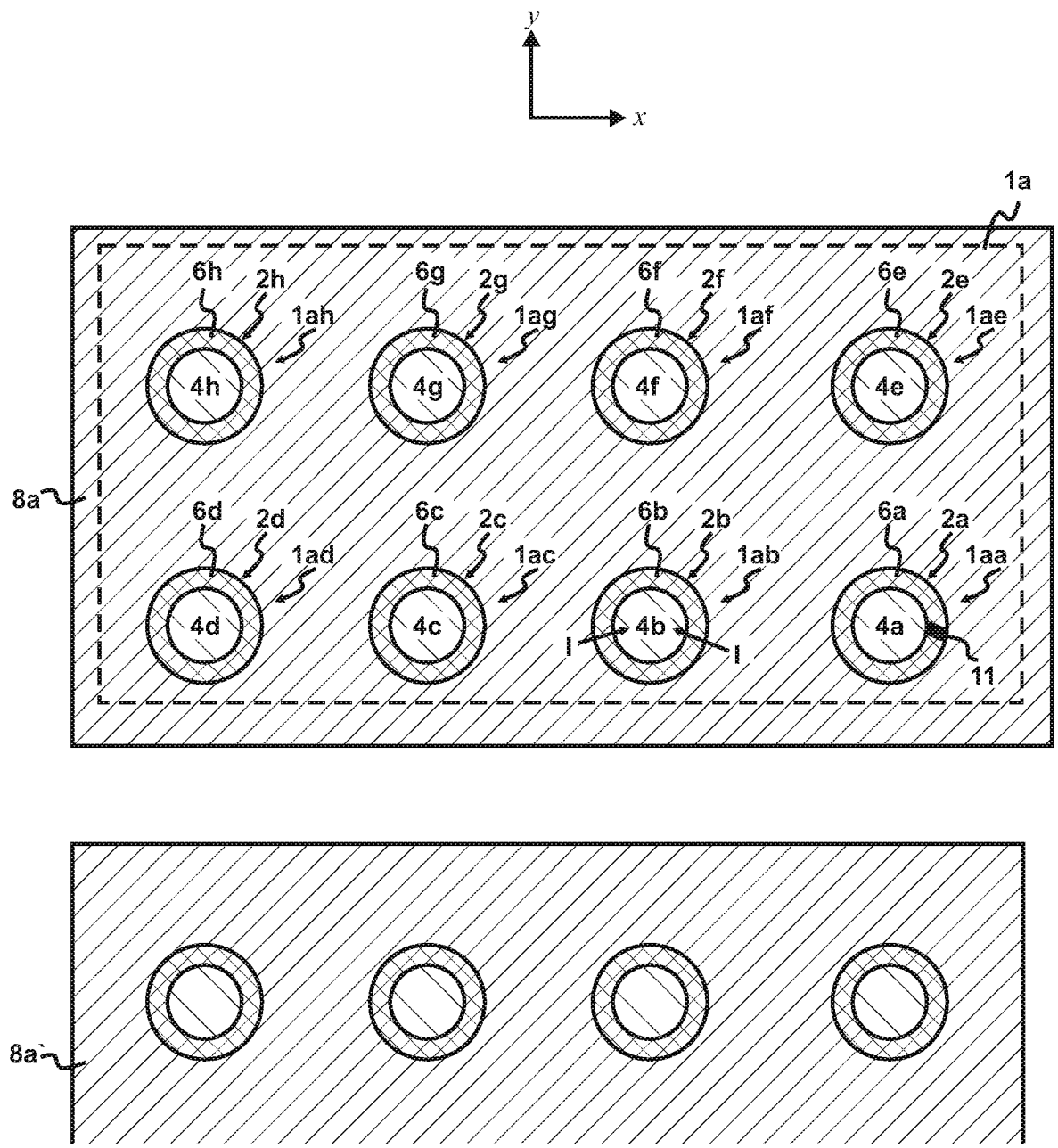
FIG. 1B is its x-y cross-sectional view along the cutline AA'.

Referring now to FIG. 1A-1B, a first preferred three-dimensional vertical one-time-programmable memory (3D-OTP$_V$) is disclosed. FIG. 1A is its z-x cross-sectional view. It comprises a plurality of vertical OTP strings 1A, 1B . . . (shorthanded to OTP strings) formed side-by-side on the substrate circuit OK. Each OTP string (e.g. 1A) is vertical to the substrate 0 and comprises a plurality of vertically stacked OTP cells 1aa-1ha.

The preferred embodiment shown in this figure is an OTP array 10, which is a collection of all OT cells sharing at least an address line. It comprises a plurality of vertically stacked horizontal address lines (word lines) 8a-8h. After the memory holes 2a-2d penetrating these horizontal address lines 8a-8h are formed, the sidewalls of the memory holes 2a-2d are covered with an antifuse layer 6a-6d before the memory holes 2a-2d are filled with at least a conductive material, which could be a metallic material or a doped semiconductor material. The conductive material in 他 the memory holes 2a-2d form vertical address lines (bit lines) 4a-4d.

The OTP cells 1aa-1ha on the OTP string 1A are formed at the intersections of the word lines 8a-8h and the bit line 4a. In the OTP cell 1aa, the antifuse layer 6a is a thin layer of insulating dielectric (e.g. silicon oxide, or silicon nitride). During programming, a conductive filament 11, which has a low resistance, is irreversibly formed therein. Except for the OTP cell 1aa, the conductive filaments in other OTP cells are not drawn.

FIG. 1B is its x-y cross-sectional view along the cutline AA'. Each of the horizontal address lines (word lines) 8a, 8a' is a conductive plate. The horizontal address line 8a is coupled with eight vertical address lines (bit lines) 4a-4h. Eight OTP cells 1aa-1ah are formed at the intersections of the horizontal address 8a and the vertical address lines 4a-4h. All OTP cells 1aa-1ah coupled with a single horizontal address line 8a form an OTP-cell set 1a. Because the horizontal address line 8a is wide, it can be formed by a low-resolution photolithography (e.g. with feature size >60 nm).

Figure 2A:
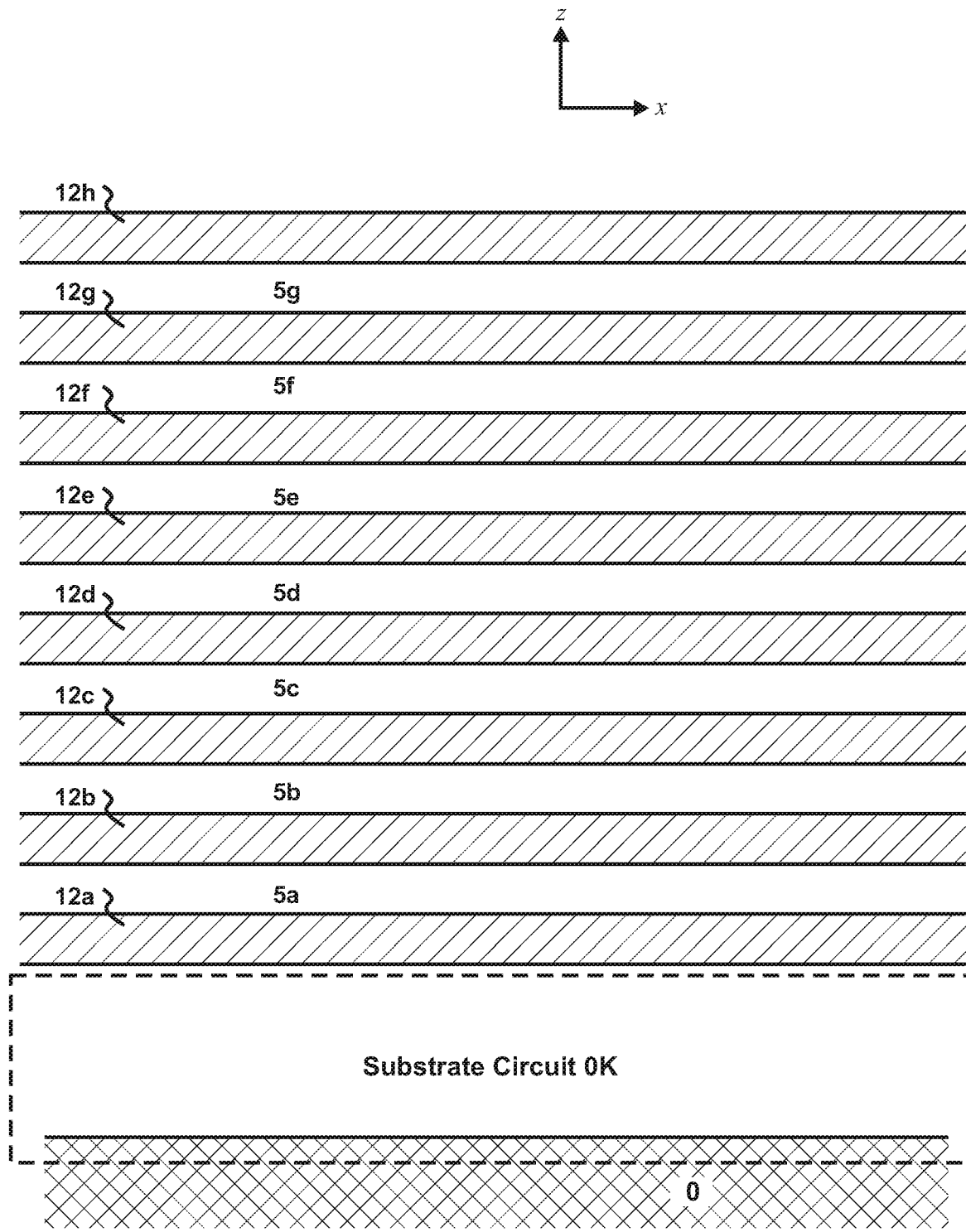
FIGS. 2A-2C are cross-sectional views of the first preferred 3D-OTP$_V$ at three manufacturing steps.
Figure 2B:
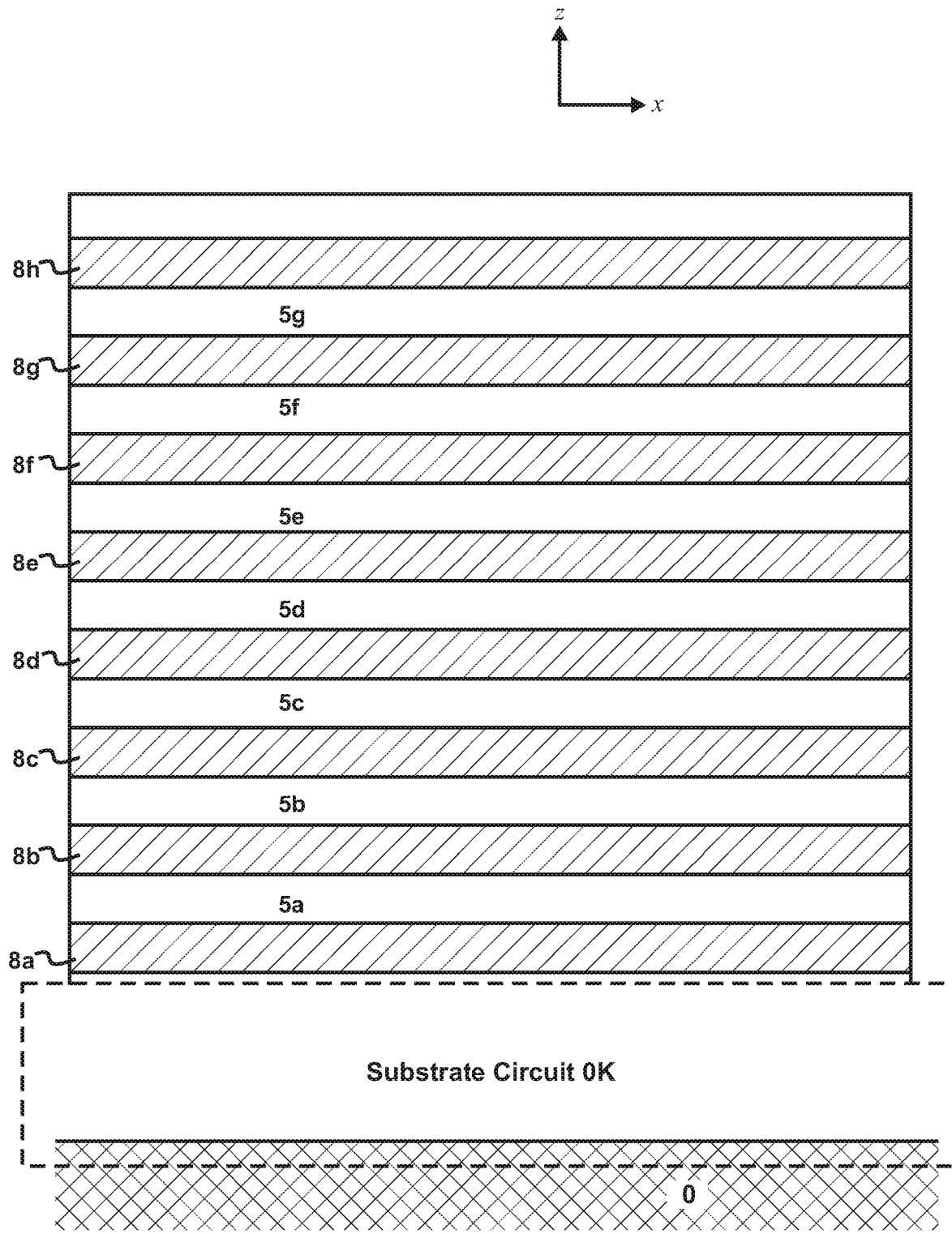
Figure 2C:
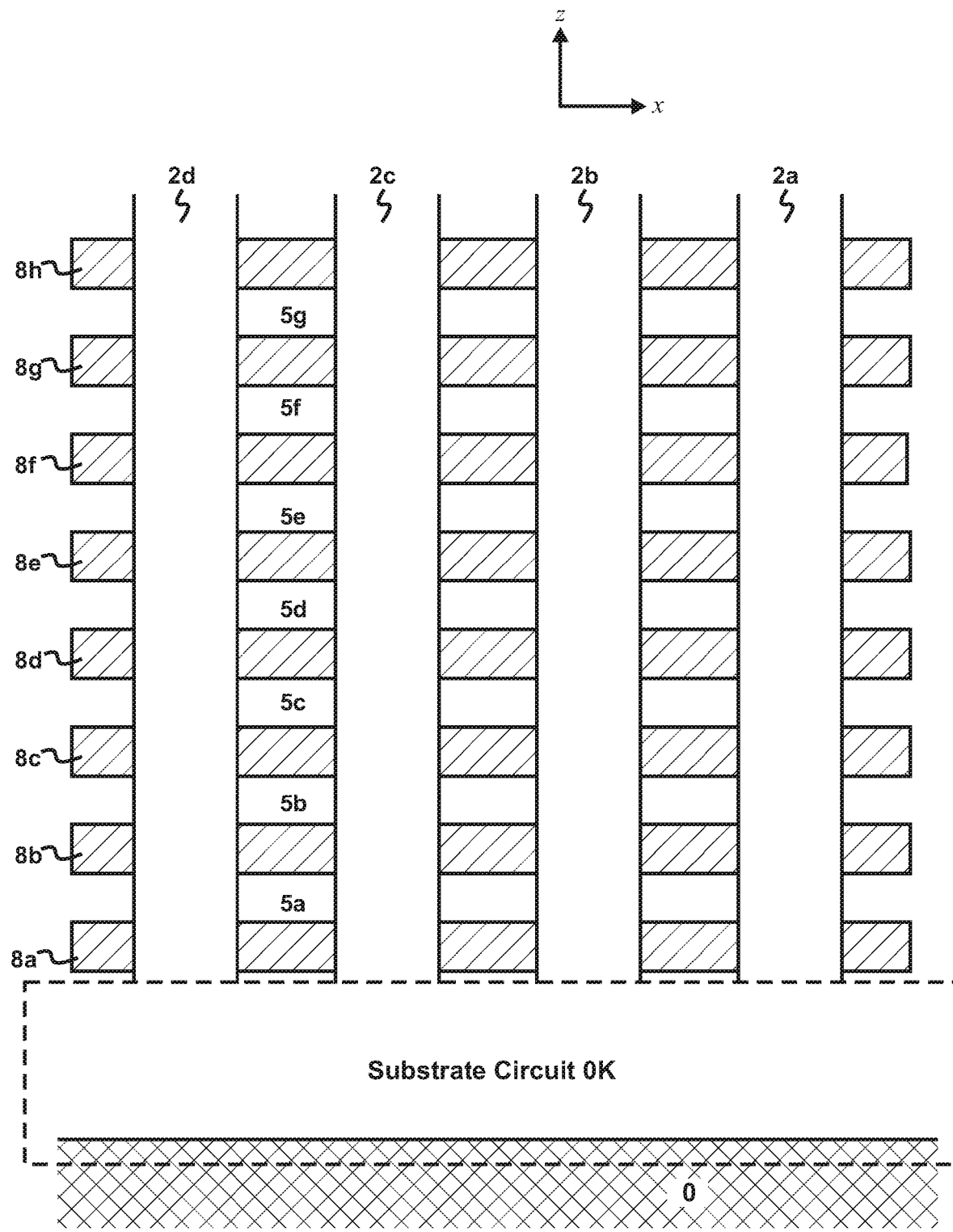

Referring now to FIGS. 2A-2C, three manufacturing steps for the preferred 3D-OTP$_V$ are shown. First of all, vertically stacked horizontal address-line layers 12a-12h are formed in continuously forming steps (FIG. 2A). To be more specific, after the substrate circuit OK (including transistors and the associated interconnects) are planarized, a first horizontal address-line layer 12a is formed. The first horizontal address-line layer 12a is just a plain layer of conductive materials and contains no patterns. Then a first insulating layer 5a is formed on the first horizontal address-line layer 12a. Similarly, the first insulating layer 5a contains no patterns. Repeating the above process until alternate layers of the horizontal address-line layers and the insulating layers (a total of M layers) are formed. "Continuously forming steps" means that these forming steps (for the horizontal address-line layer and the insulating layer) are carried out continuously without any in-between pattern-transfer steps (including photolithography). Without any in-between pattern-transfer steps, excellent planarization can be achieve. As a result, the 3D-OTP$_V$ comprising tens to hundreds of horizontal address-line layers can be formed. This is significantly more than the 3D-OPT$_H$.

A first etching step is performed through all horizontal address-line layers 12a-12h to form a stack of horizontal address lines 8a-8h in (FIG. 2B). This is followed by a second etching step to form memory holes 2a-2d through all horizontal address lines 8a-8h (FIG. 2C). The sidewall of the memory holes 2a-2d is covered by an antifuse layers 6a-6d before the memory holes 2a-2d are filled with at least a conductive material to form the vertical address lines 4a-4d (FIG. 1A).

Figure 3A:
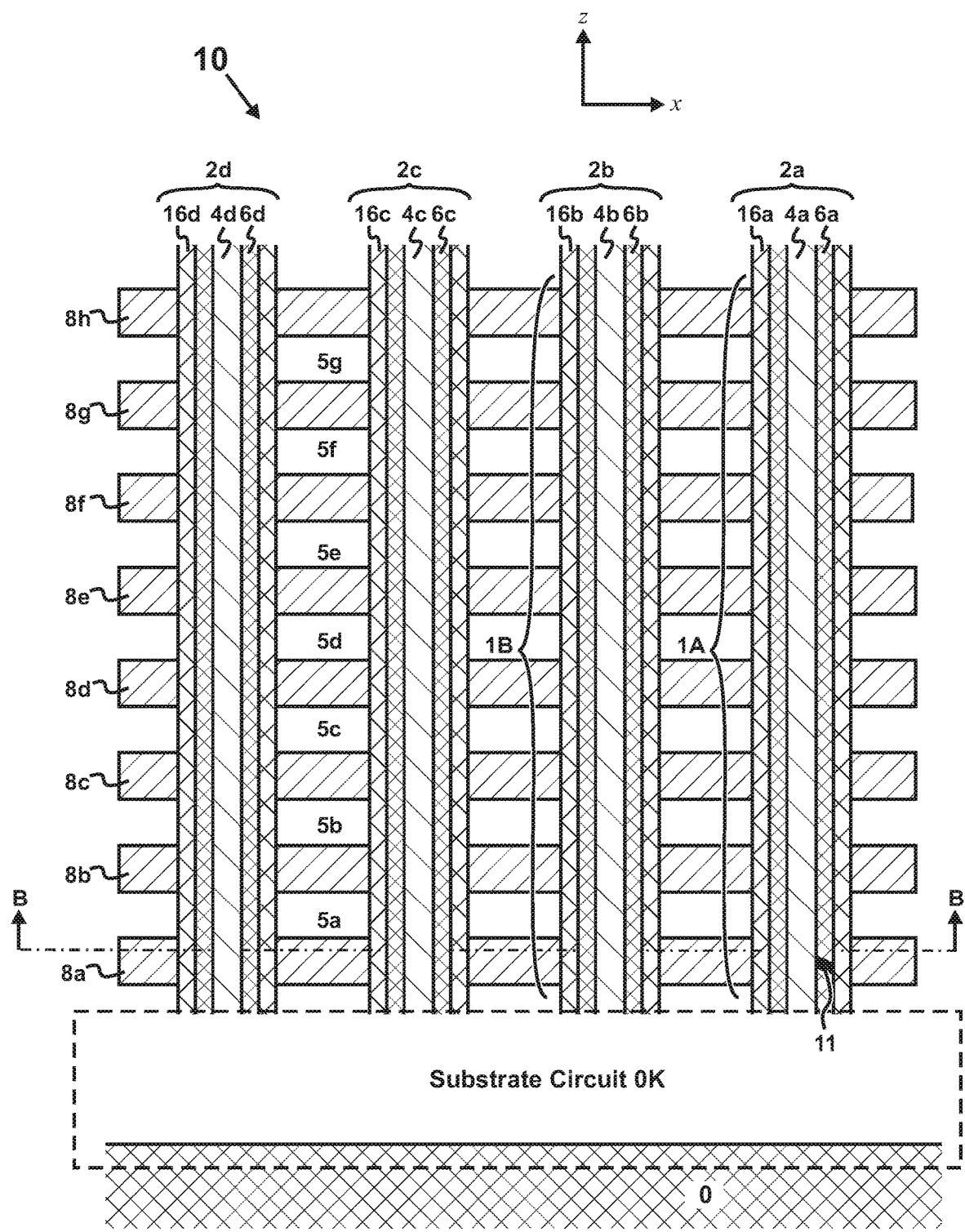
FIG. 3A is a z-x cross-sectional view of a second preferred 3D-OTP$_V$.
Figure 3B:
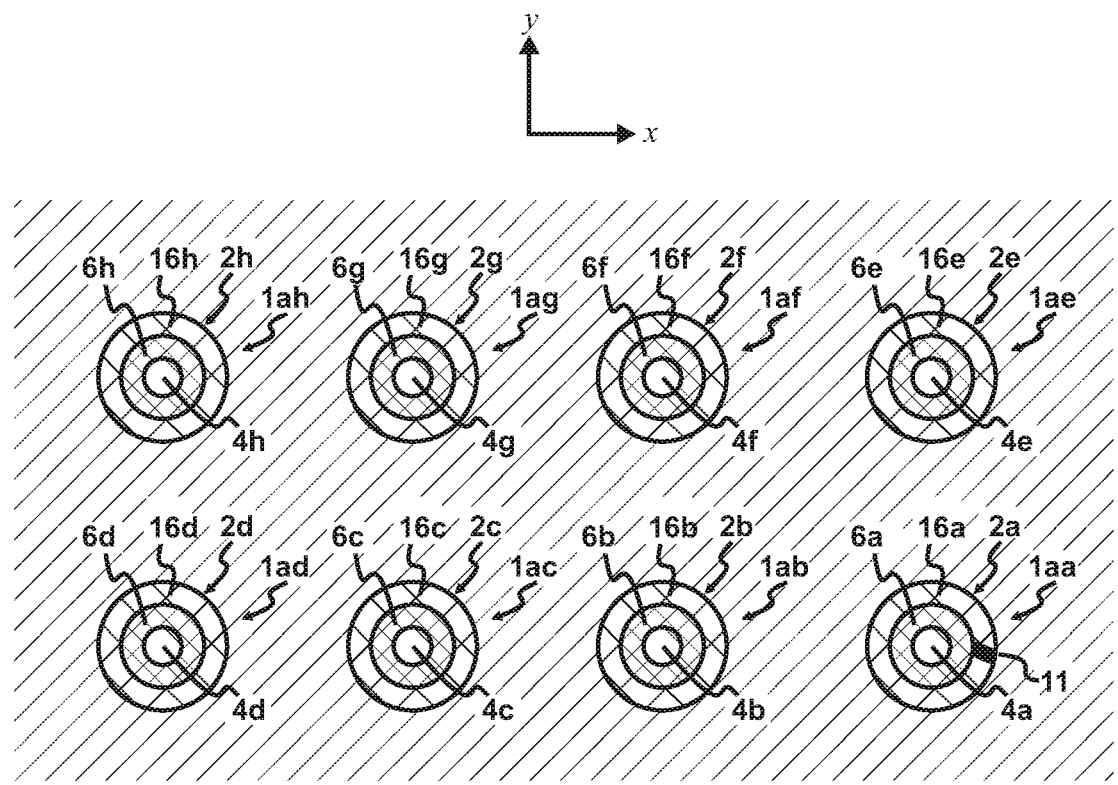
FIG. 3B is its x-y cross-sectional view along the cutline BB'.

Referring now to FIG. 3A-3B, a second preferred 3D-OTP$_V$ 10 is disclosed. FIG. 3A is its z-x cross-sectional view; FIG. 3B is its x-y cross-sectional view along the cutline BB'. It is similar to FIG. 1A-1B, except that each memory hole (e.g. 2a) further comprises a quasi-conductive layer (e.g. 16a). The quasi-conductive layer 16a is the major component of a diode. It has the following properties: its resistance at the read voltage (read resistance) is substantially lower than when the applied voltage has a magnitude smaller than or polarity opposite to that of the read voltage. The quasi-conductive layers 16a-16d could be a ceramic layer (e.g. a metal-oxide layer). In this preferred embodiment, the quasi-conductive layers 16a-16d are formed between the sidewalls of the memory holes 2a-2d and the antifuse layers 6a-6d. Alternatively, the antifuse layers 6a-6d can be formed between the sidewalls of the memory holes 2a-2d and the quasi-conductive layer 16a-16d.

Figure 4A:
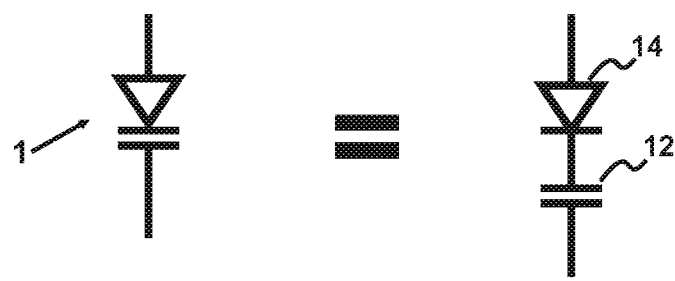
FIG. 4A is a symbol of the OTP cell.

FIG. 4A is a symbol of the OTP cell 1. It means that the OTP cell 1 comprises an antifuse 12 and a diode 14. The antifuse 12 comprises the antifuse layer 6a-6d whose resistance is irreversibly switched from high to low during programming. The diode 14 comprises the quasi-conductive layer 16a-16d and can be broadly interpreted as any two-terminal device whose resistance at the read voltage is substantially lower than when the applied voltage has a magnitude smaller than or polarity opposite to that of the read voltage.

Exemplary diodes 14 include semiconductor diodes, Schottky diodes and ceramic diodes. For the semiconductor diodes 14, the horizontal address lines 8a-8h comprise a P+ semiconductor material, while the vertical address lines 4a-4d comprise an N+ semiconductor material. For the Schottky diodes 14, Schottky diodes 14 are formed between the horizontal address lines 8a-8h and the vertical address lines 4a-4d. In one preferred example, the horizontal address lines 8a-8h comprise at least a metallic material, while the vertical address lines 4a-4d comprise at least a doped semiconductor material. In another preferred example, the horizontal address lines 8a-8h comprise at least a doped semiconductor material, while the vertical address lines 4a-4d comprise at least a metallic material. For the ceramic diodes 14, ceramic layers (e.g. metal-oxide layers) separate the horizontal address lines 8a-8h from the b vertical address it lines 4a-4d.

In an OTP cell (e.g. 1aa), the dimension of the diode's cathode is equal to the radius of the memory hole (e.g. 2a). Because this cathode is too small to suppress the leakage current of the diode, the OTP cell could be leaky. To address this issue, the present invention discloses a full-read mode. For the full-read mode, all OTP cells on a selected word line are read out during a read cycle.

Figure 4B:
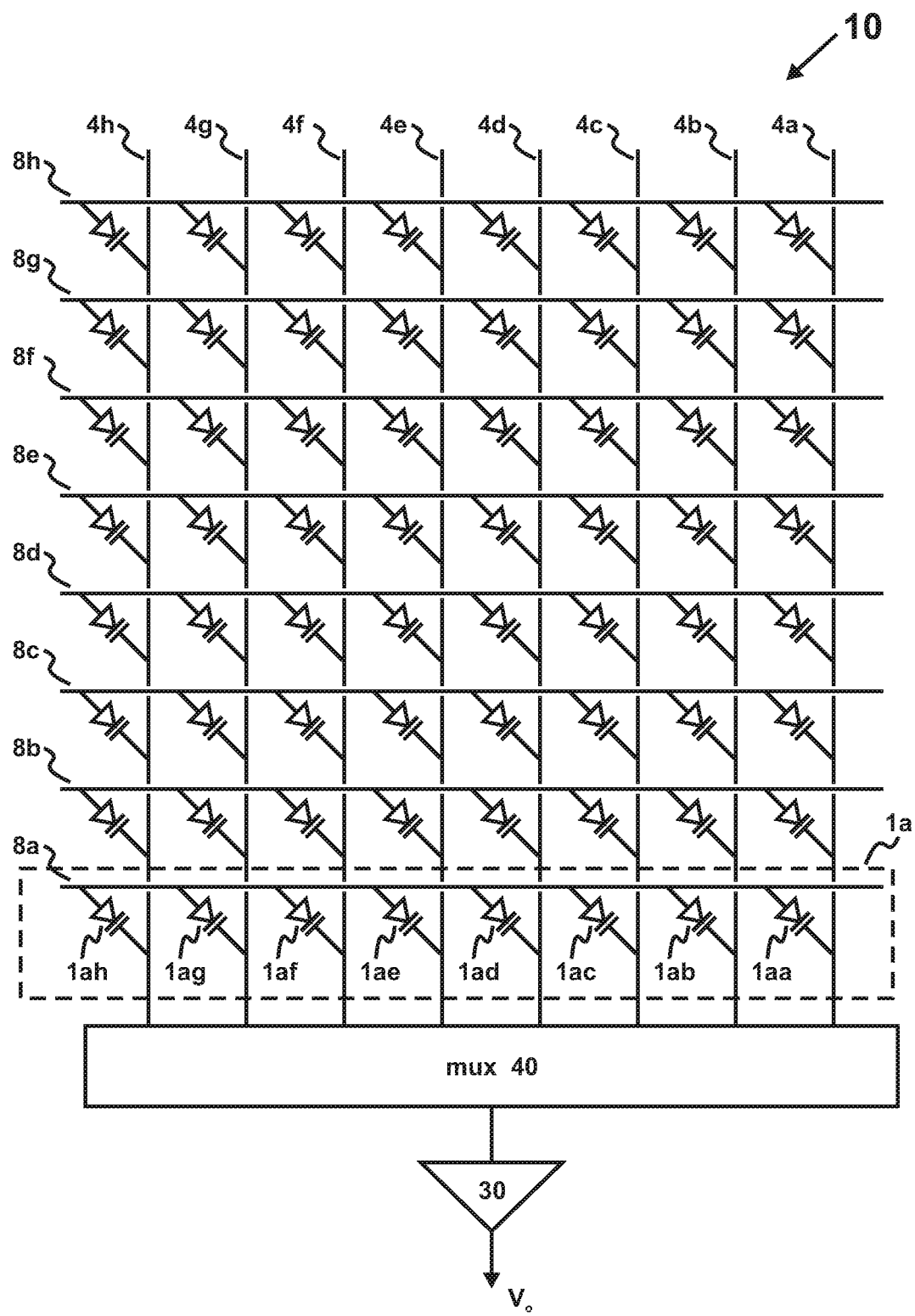
FIG. 4B is a circuit block diagram of a first preferred read-out circuit for an OTP array.

FIG. 4B discloses a first preferred read-out circuit for an OTP array 10. It runs in the full-read mode. In the language of electronic circuitry, the horizontal address lines 8a-8h are word lines, while the vertical address lines 4a-4h are bit lines. An OTP array 10 comprises the word lines 8a-8h, the bit lines 4a-4h, and the OTP cells 1aa-1ad . . . located at their intersections. Its peripheral circuits (located on the substrate 0 and is not part of the OTP array 10) comprise a multiplexor 40 and an amplifier 30. In this preferred embodiment, the multiplexor 40 is a 4-to-1 multiplexor.

Figure 4C:
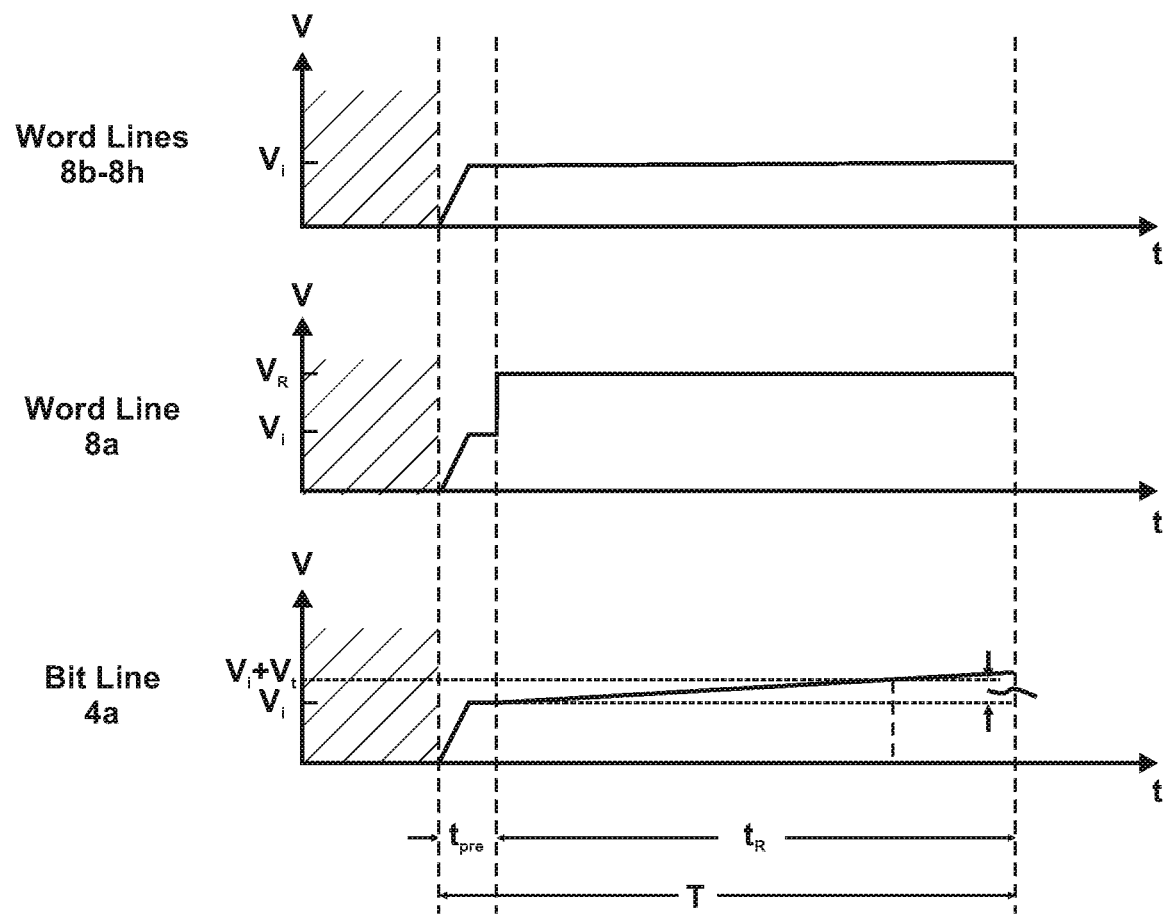
FIG. 4C is its signal timing diagram.

FIG. 4C is its signal timing diagram. A read cycle T includes two read phases: a pre-charge phase $t_{pre}$ and a read-out phase $t_R$. During the pre-charge phase $t_{pre}$, all address lines 8a-8h, 4a-4h in the OTP array 10 are charged to a pre-determined voltage (e.g. an input bias voltage $V_i$ of the amplifier 30). During the read-out phase $t_R$, all bit lines 4a-4h are floating. The voltage on a selected word line (e.g. 8a) is raised to the read voltage $V_R$, while voltage on other word lines 8b-8h remains at the input bias voltage $V_i$. After this, the selected word line 8a starts to charge all bit lines 4a-4h through the OTP cells 1aa . . . and the voltages on the bit lines 4a-4h begin to rise. The multiplexor 40 sends the voltage on each bit line (e.g. 4a) to the amplifier 30. When this voltage exceeds the threshold voltage $V_T$ of the amplifier 30, the output $V_O$ is toggled. At the end of the read cycle T, the states of all OTP cells 1aa-1ah in the OTP-cell set 1a are determined.

Figure 4D:
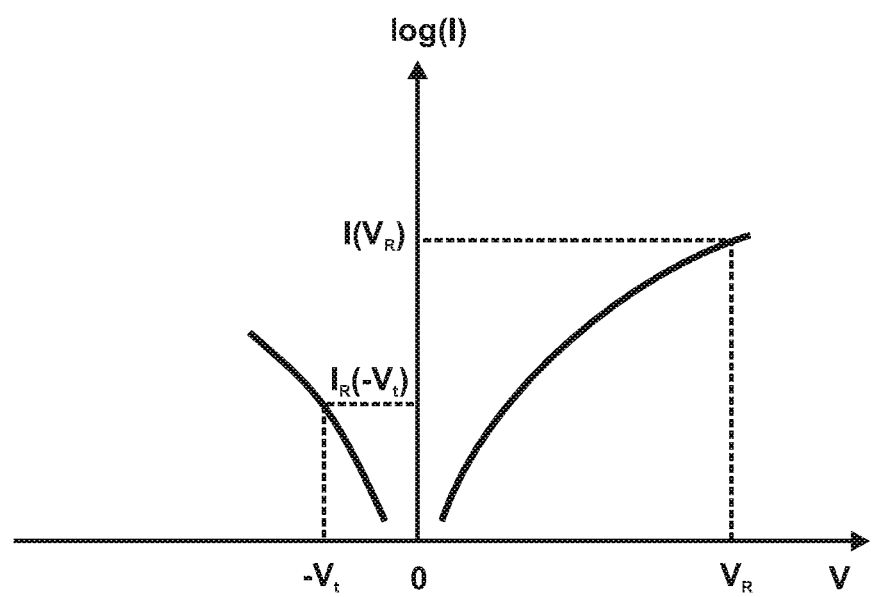
FIG. 4D shows the current-voltage (I-V) characteristic of a preferred quasi-conductive layer.

FIG. 4D shows the current-voltage (I-V) characteristic of a preferred quasi-conductive layer. Because the $V_T$ of the amplifier 30 is relatively small (~0.1V or smaller), the voltage changes delta(V) on the bit lines 4a-4h during the above measurement are small, i.e. delta(V)~$V_T$. The reverse voltage on the unselected OTP cells (e.g. 1 ca) is ~$V_T$. As long as the I-V characteristic of the quasi-conductive layer satisfies $I(V_R) \gg I(-V_T)$, the 3D-OTP$_V$ would work properly even with leaky OTP cells.

Figure 5A:
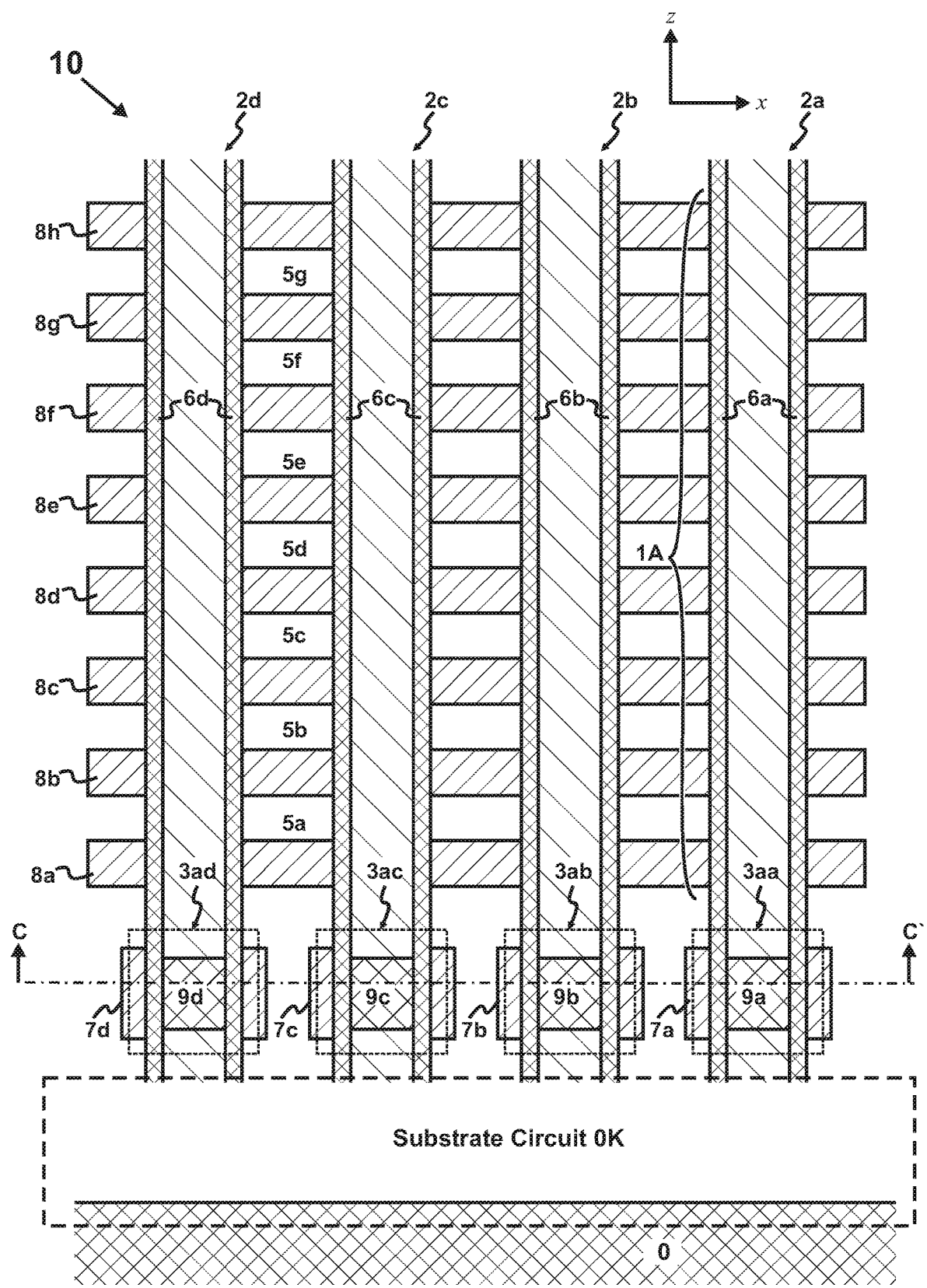
FIG. 5A is a z-x cross-sectional view of a third preferred 3D-OTP$_V$.
Figure 5B:
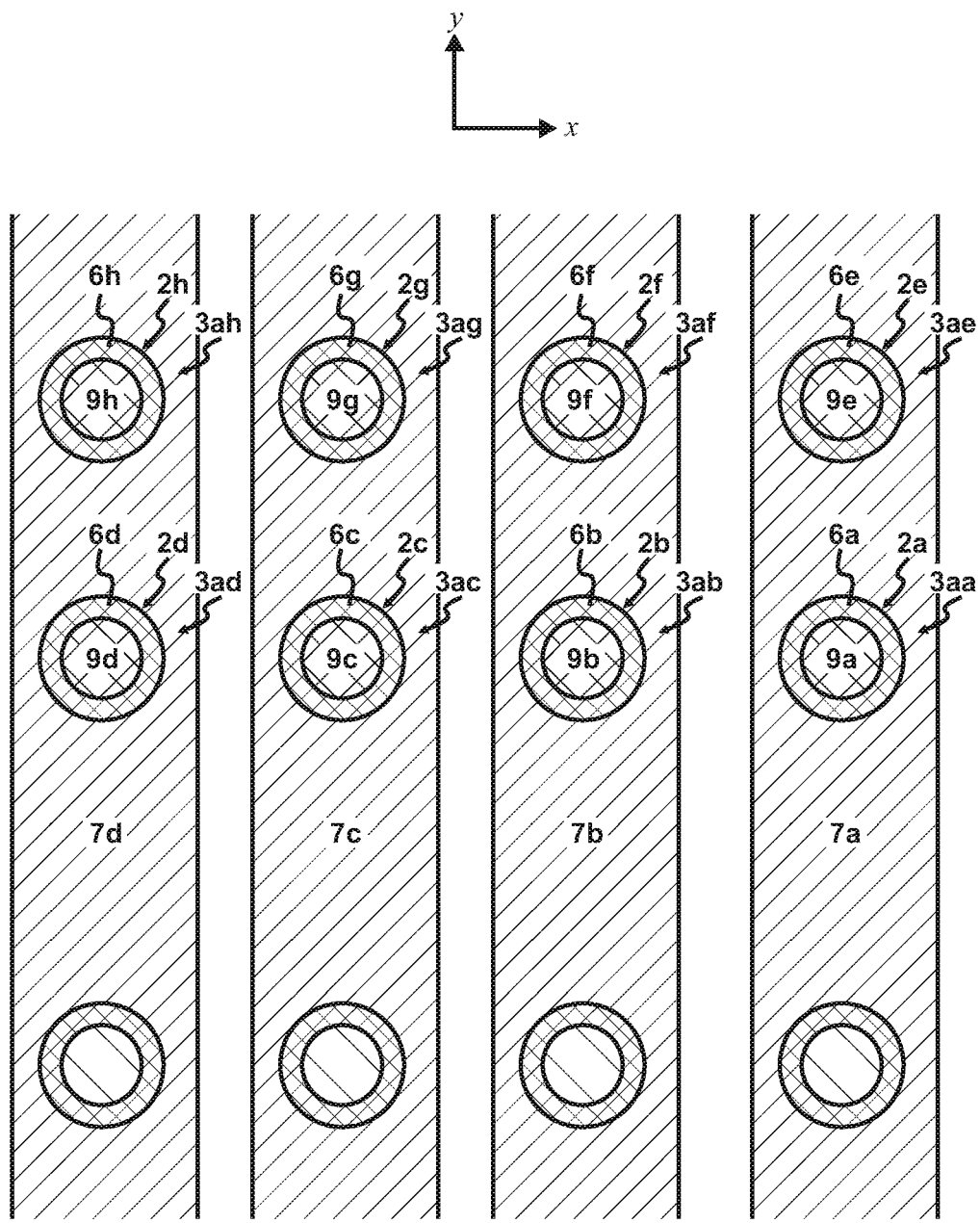
FIG. 5B is its x-y cross-sectional view along the cutline CC'.
Figure 5C:
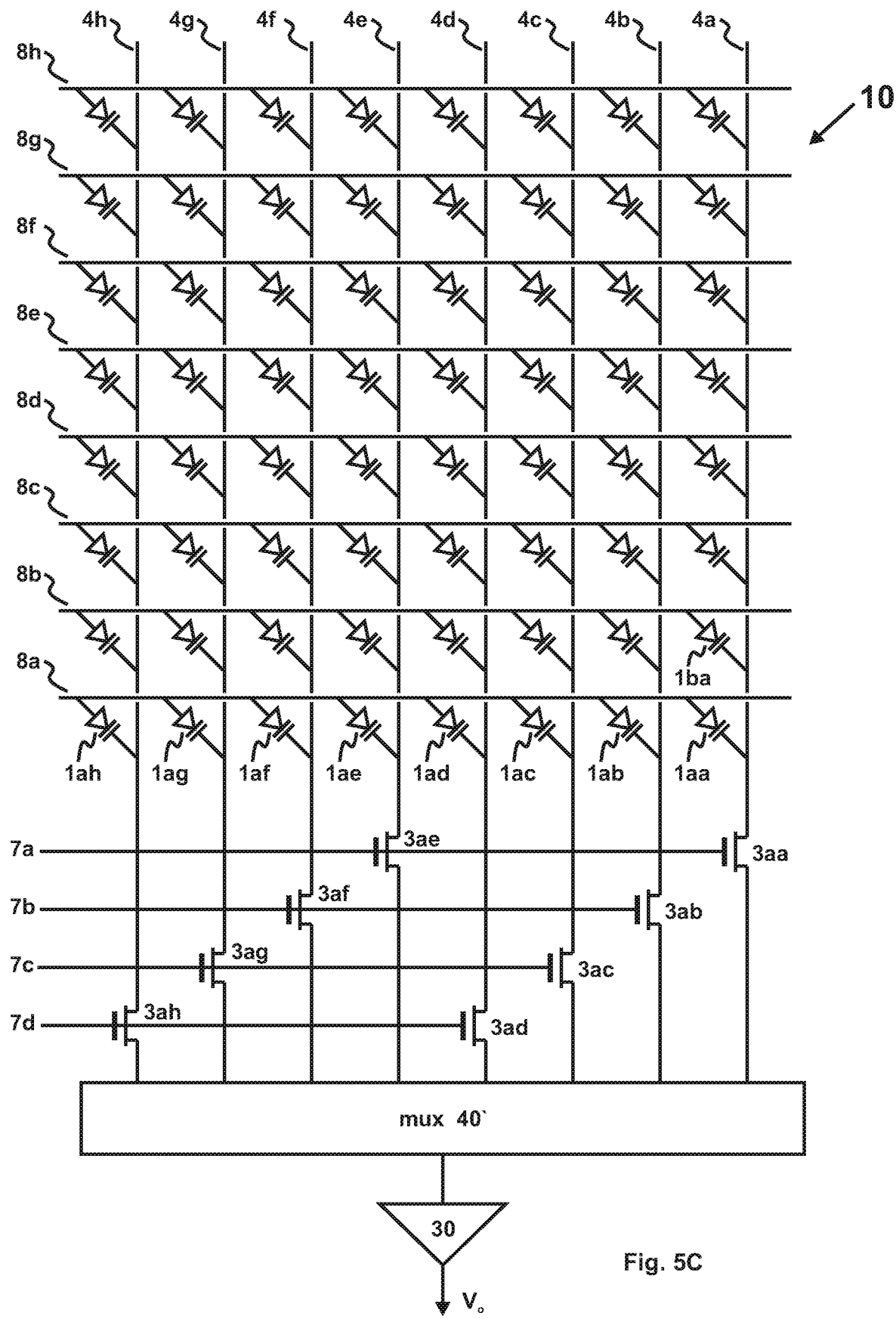
FIG. 5C is a circuit block diagram of a second preferred read-out circuit for an OTP array.

To facilitate address decoding, vertical transistors are formed on the sidewalls of the memory holes. FIGS. 5A-5C disclose a third preferred 3D-OTP$_V$ 10 comprising vertical transistors 3aa-3ad. The vertical transistor $3_{aa}$ is a pass transistor comprising a gate 7a, a gate dielectric 6a and a channel 9a (FIG. 5A). The channel 9a is formed in the semiconductor material filled in the memory hole 2a. Its doping could be same as, lighter than, or opposite to that of the vertical address line 4a. The gate 7a surrounds the memory holes 2a, 2e and controls the pass transistors 3aa, 3ae (FIG. 5B); the gate 7b surrounds the memory holes 2b, 2f and controls the pass transistors 3ab, 3af; the gate 7c surrounds the memory holes 2c, 2g and controls the pass transistors 3ac, 3ag; the gate 7d surrounds the memory holes 2e, 2h and controls the pass transistors 3ae, 3ah. The pass transistors 3aa-3ah form at least a decoding stage (FIG. 5C). In one preferred embodiment, when the voltage on the gate 7a is high while the voltages on the gates 7b-7d are low, only the pass transistors 3aa, 3ae are turn on, with other pass transistors off. The substrate multiplexor 40' is a 2-to-1 multiplexor which selects a signal from the bit lines 4a, 4e. By forming vertical transistors 3aa-3d in the memory holes 2a-2d, the decoder design could be simplified.

Figure 6:
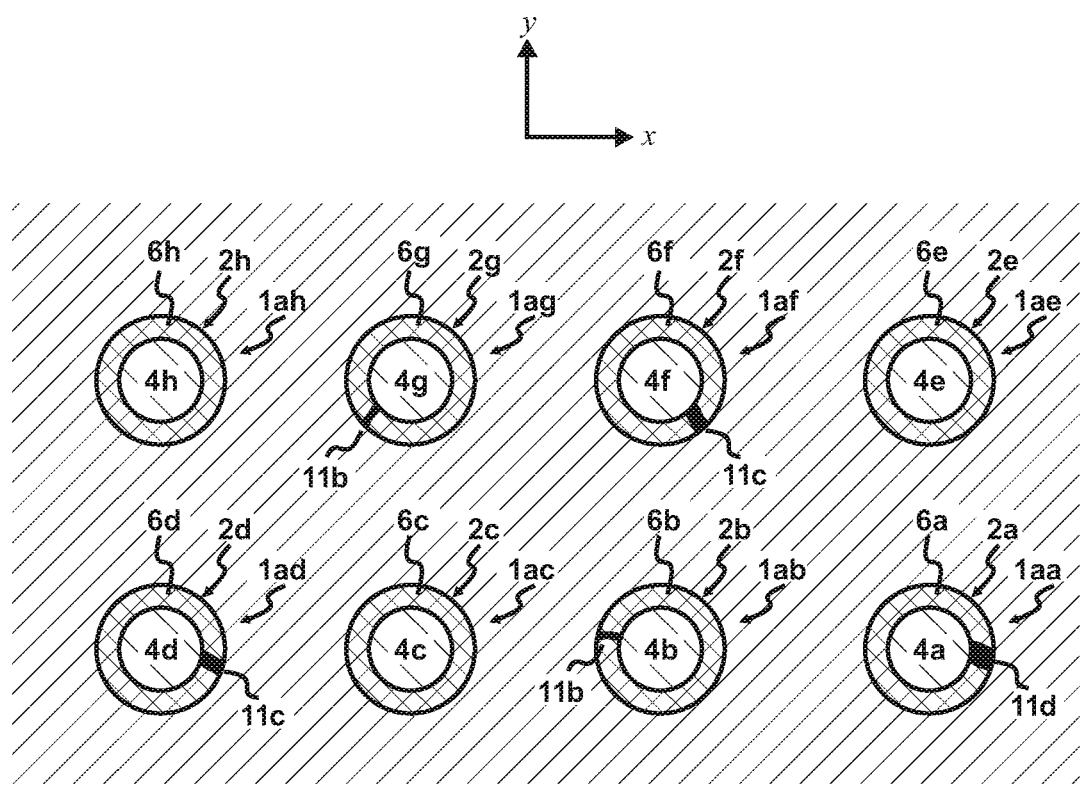
FIG. 6 is a cross-sectional view of a multi-bit-per-cell 3D-OTP$_V$.

FIG. 6 discloses a multi-bit-per-cell 3D-OTP$_V$. It comprises a plurality of OTP cells 1aa-1ah. In this preferred embodiment, the OTP cells 1aa-1ah have four states: '0', '1', '2', '3'. The OTP cells 1aa-1ah in different states are programmed by different programming currents and therefore, have different resistance. The OTP cells 1ac, 1ae, 1ah are in the state '0'. Being un-programmed, their antifuse layers 6c, 6e, 6h are intact. Other OTP cells are programmed. Among them, the OTP cells 1ab, 1ag are in the state '1', which have the largest resistance as the conductive filaments 11b are the thinnest; the OTP cell 1aa is in the state '3', which has the smallest resistance as the conductive filament 11d is the thickest; the OTP cells 1ad, 1af are in the state '2, which have an intermediate resistance as the size of its conductive filament 11c is between those of 11b and 11d.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A three-dimensional vertical one-time-programmable memory (3D-OTP$_V$), comprising:
   a semiconductor substrate comprising a substrate circuit;
   a plurality of vertically stacked horizontal address lines above said semiconductor circuit;
   a plurality of memory holes through said horizontal address lines;
   an antifuse layer on and in contact with the sidewalls of said memory holes, wherein said antifuse layer is irreversibly switched from a high-resistance state to a low-resistance state during programming;
   a plurality of vertical address lines in said memory holes and in contact with said antifuse layer;
   a plurality of OTP cells at the intersections of said horizontal and vertical address lines, wherein said horizontal and vertical address lines form a Schottky diode at a selected one of said OTP cells whose antifuse layer is in said low-resistance state;
   wherein said horizontal and vertical address lines are separated by said antifuse layer only.

2. The 3D-OTP$_V$ according to claim 1, wherein said horizontal address lines comprise at least a metallic material, said vertical address lines comprise at least a doped semiconductor material.

3. The 3D-OTP$_V$ according to claim 1, wherein said horizontal address lines comprise at least a doped semiconductor material, said vertical address lines comprise at least a metallic material.

4. The 3D-OTP$_V$ according to claim 1, wherein said plurality of OTP cells form a vertical OTP string.

5. The 3D-OTP$_V$ according to claim 4, further comprising a vertical transistor coupled to said OTP string.

6. The 3D-OTP$_V$ according to claim 5, wherein said vertical transistor is formed in a first portion of selected one of said memory holes, and said OTP string is formed in a second portion of said selected one of said memory holes.

7. The 3D-OTP$_V$ according to claim 1, wherein said OTP cells have more than two states, the OTP cells in different states having different resistance values.

8. A three-dimensional vertical one-time-programmable memory (3D-OTP$_V$), comprising:
   a semiconductor substrate comprising a substrate circuit;
   a plurality of vertically stacked horizontal address lines above said semiconductor circuit, said horizontal address lines comprising at least a metallic material;
   a plurality of memory holes through said horizontal address lines;
   an antifuse layer on and in contact with the sidewalls of said memory holes, wherein said antifuse layer is irreversibly switched from a high-resistance state to a low-resistance state during programming;
   a plurality of vertical address lines in said memory holes and in contact with said antifuse layer, said vertical address lines comprising at least a doped semiconductor material;
   a plurality of OTP cells at the intersections of said horizontal and vertical address lines, wherein said horizontal and vertical address lines form a Schottky diode at a selected one of said OTP cells whose antifuse layer is in said low-resistance state;
   wherein said horizontal and vertical address lines are separated by said antifuse layer only.

9. The 3D-OTP$_V$ according to claim 8, wherein a vertical transistor is formed in a first portion of selected one of said memory holes, and said plurality of OTP cells are formed in a second portion of said selected one of said memory holes.

10. The 3D-OTP$_V$ according to claim 8, wherein said OTP cells have more than two states, the OTP cells in different states having different resistance values.

11. A three-dimensional vertical one-time-programmable memory (3D-OTP$_V$), comprising:
    a semiconductor substrate comprising a substrate circuit;
    a plurality of vertically stacked horizontal address lines above said semiconductor circuit, said horizontal address lines comprising at least a doped semiconductor material;
    a plurality of memory holes through said horizontal address lines;
    an antifuse layer on and in contact with the sidewalls of said memory holes, wherein said antifuse layer is irreversibly switched from a high-resistance state to a low-resistance state during programming;
    a plurality of vertical address lines in said memory holes and in contact with said antifuse layer, said vertical address lines comprising at least a metallic material;
    a plurality of OTP cells at the intersections of said horizontal and vertical address lines, wherein said horizontal and vertical address lines form a Schottky diode at a selected one of said OTP cells whose antifuse layer is in said low-resistance state;
    wherein said horizontal and vertical address lines are separated by said antifuse layer only.

12. The 3D-OTP$_V$ according to claim 11, wherein a vertical transistor is formed in a first portion of selected one of said memory holes, and said plurality of OTP cells are formed in a second portion of said selected one of said memory holes.

13. The 3D-OTP$_V$ according to claim 11, wherein said OTP cells have more than two states, the OTP cells in different states having different resistance values.

* * * * *